United States Patent [19]
Schotthoefer et al.

[11] 3,930,307
[45] Jan. 6, 1976

[54] ASSEMBLY OF WIRING HARNESS

[75] Inventors: Jerome W. Schotthoefer, New Baltimore; Donald J. Lewis, Troy, both of Mich.

[73] Assignee: Allied Chemical Corporation, New York, N.Y.

[22] Filed: July 1, 1974

[21] Appl. No.: 484,530

[52] U.S. Cl............ 29/628; 29/203 B; 29/203 MW; 29/624
[51] Int. Cl.² .......................................... H01R 43/00
[58] Field of Search ....... 29/203 MW, 203 B, 203 J, 29/203 P, 203 R, 624, 628, 407, 574; 317/122

[56] References Cited
UNITED STATES PATENTS

| | | | |
|---|---|---|---|
| 2,768,428 | 10/1956 | MacGregor et al. | 29/203 MW |
| 2,805,471 | 9/1957 | Lowden | 29/203 MW |
| 3,259,968 | 7/1966 | Dyksterhouse | 29/203 MW |
| 3,705,347 | 12/1972 | Tuller | 29/203 MW |
| 3,706,134 | 12/1972 | Sweeney et al. | 29/203 MW |
| 3,842,496 | 10/1974 | Mercer | 29/203 B |

Primary Examiner—C. W. Lanham
Assistant Examiner—James R. Duzan
Attorney, Agent, or Firm—Johnathan Plaut; John P. Kirby, Jr.

[57] ABSTRACT

The method and apparatus includes the use of at least one pallet, an assembly line, a projector means, and an electrical testing means. Assembly of the wiring harnesses takes place on the pallets which are either independently powered or move on a powered conveyor line. In either alternative, the pallets move along a non-synchronous, power and free assembly line. An overhead projector means is provided above selected work stations to project instructions and diagrams on the pallet. Electrical testing means are used to test the wiring harnesses during assembly, prior to completion of assembly, and to control movement of the pallet to the next work station. The method includes testing partially assembled components for electrical opens, shorts and incorrectly assembled components on the pallet at intermediate stages of assembly and passing the partially assembled components to the next stage of assembly only when the components have been shown to be correctly assembled.

13 Claims, 7 Drawing Figures

DISPLAY-TWO CIRCUITS SHORTED TOGETHER

DISPLAY- TWO CIRCUITS CROSSED

DISPLAY-ALL CIRCUITS COMPLETE AND CORRECT

3,930,307

ASSEMBLY OF WIRING HARNESS

BACKGROUND OF THE INVENTION

This invention relates to a method and apparatus for the assembly and testing of intricate components. One example of the use of such a method and apparatus is in the assembly and testing of wiring harnesses for vehicles, such as automobiles. Such wiring harnesses require the assembly and testing of a plurality of intricate electrical components, such as electrical wires, resistors, capacitors, switches and fuses. The method and apparatus of this invention is addressed to two broad functions: assembly and testing. The testing function is conducted during the various stages of assembly, rather than after assembly has been completed.

The assembly and testing of wiring harness requires that the wiring harnesses be tested for electrical continuity and that the wiring harnesses be free of electrical open, crossed, shorted and incomplete circuits. For example, among the typical problems which may occur during the assembly of wiring harnesses are: Wires may be connected to the wrong pins in a connector. Wires may be connected to the wrong connector. Insulation strips may be improperly assembled at the connector and allow two wires to short circuit. A connector may have defective contacts. Contacts of a wire may not be fully inserted into the connector. In prior art assembly lines, when wiring harnesses are fully assembled and then tested, the wiring harnesses which are found defective must be discarded or set aside for further analysis and repair.

Typical prior art apparatus and methods, such as U.S. Pat. No. 2,768,428 to MacGregor et al., use a synchronized conveyor belt system and only test for electrical misconnection or continuity. Some prior art apparatus and methods allow the wiring harness to continue along the assembly to completion of assembly before defects are corrected. In addition, the use of an overhead projector above a work surface to provide a lighted arrow to direct the assembly of electrical components, such as wiring harnesses, has been disclosed in promotional literature by Ragen Precision Industries, Inc., 9 Porete Avenue, North Arlington, N.J.

SUMMARY OF THE INVENTION

The apparatus of this invention for the assembly of components includes: at least one pallet, an assembly line along which the pallet moves, and electrical testing means for testing the assembled components on the pallet before completion of assembly of the components. The components are assembled on the pallet. The assembly line has a plurality of work stations. The pallets are adapted to move from one work station to another work station independently of other pallets as the components are assembled on the pallets. The electrical testing means is used to determine the presence of electrical shorted conditions, electrical open conditions and incorrectly assembled components. The pallets are adapted to move from one work station to the next work station only when testing by the electrical testing means has been completed and all components have been shown to be correctly assembled at the respective work station. The pallets may be independently powered to move along the assembly line or the assembly line may be powered to move the pallet or pallets.

The method of this invention for the assembly of components comprises: collecting the components to be assembled on one of a plurality of independently powered pallets, moving the pallet from one work station to another work station along an assembly line independently of other pallets; assembling the components on the pallet as work stations along the assembly line; electrically testing the partially assembled components at intermediate stages of assembly prior to completion of assembly; and passing the partially assembled components on the pallet to the next stage of assembly only when the testing has been completed and the components have been shown to be correctly assembled.

The method and apparatus of this invention may be broadly divided into two separate functions: (1) mechanical assembly; and (2) electrical testing. One example of a use for the method and apparatus for this invention is for the assembly of wiring harnesses for vehicles. Testing is performed at various stages during assembly of each wiring harness, rather than after the wiring harness has been completely assembled.

Assembly and testing of each wiring harness takes place on pallets. A plurality of pallets move along an assembly line with various steps of assembly and testing performed on the harness components at different work stations along the assembly line. A selected pallet may be moved on and off the assembly line or may be moved to different stations along the assembly line. For example, if an error has been made during the assembly of one of the components of the wiring harness, the pallet having the erroneously assembled wiring harness, or a portion of a wiring harness, may be moved to a repair station as soon as the error is discovered, rather than waiting until the entire harness has been assembled before attempting to correct the error. Thus, further assembly of this wiring harness does not proceed until the error is corrected.

Projecting means, such as overhead projectors are provided for the purpose of projecting instructions and diagrams on the pallets. These instructions and diagrams provide specific information to the assembly operator as to how the wiring harness and its associated components should be assembled at the work station.

The method and apparatus of this invention includes the use of subassembly modules which constitute portions of the wiring harness. These subassembly modules are assembled, preferably assembled on a pallet by a similar method, and then brought to the final assembly line for assembly into the complete wiring harness. A predetermined number of circuits are assembled on the individual pallets at various work stations along the assembly line. The pallet is provided with a number of mounting bases to which various electromechanical connections are made. These mounting bases may be retained magnetically on the pallet and can be quickly changed or moved as necessitated by engineering changes or volume requirements. The particular circuits to be incorporated at any given work station are displayed on the pallet by the use of overhead projectors.

The pallet may be completely controlled by an electrical testing means, such as a circuit analyzer, at all or at selected work stations. The circuit analyzer will inform the assembler that the subject circuits on the pallet moving on the assembly line are incomplete, shorted, or complete. The movement of each pallet is directly controlled by the circuit analyzer at the particular work station and it cannot move from that station unless the designated portion of the harness is correctly assembled. When the circuit analyzer at a particular station indicates that the portion of the harness is correctly assembled, it automatically moves to the next work station. Work stations are separated sufficiently to allow pallets to be temporarily stored at waiting stations, ready for the next operation. With this type of assembly technique, the assembly line is less subject to stoppage. There is no possibility that a faulty harness could be assembled to completion. The assembly line is easily adjustable to various production line lengths and numbers of circuits, thus assuring flexibility required by engineering changes and harnesses having different types of circuitry.

As a result, the assembly line of this invention assures 100 percent electrical continuity of all components and finished assemblies of the wiring harness, as the wiring harness leaves the assembly line. The periodic monitoring of the assembly of wiring harnesses as they are assembled along the assembly line achieves high quality levels of assembly, reduced assembly time and reduction of final assembly line rejects.

DETAILED DESCRIPTION

The apparatus and method of this invention is for the assembly of intricate components, such as the assembly of electrical wires, resistors, capacitors, switches and fuses and other electrical components into a wiring harness adapted to be used in an automobile. However, the apparatus and method of this invention may also be used for the assembly of a wide variety of other components into different products, other than wiring harnesses.

Figure 1:
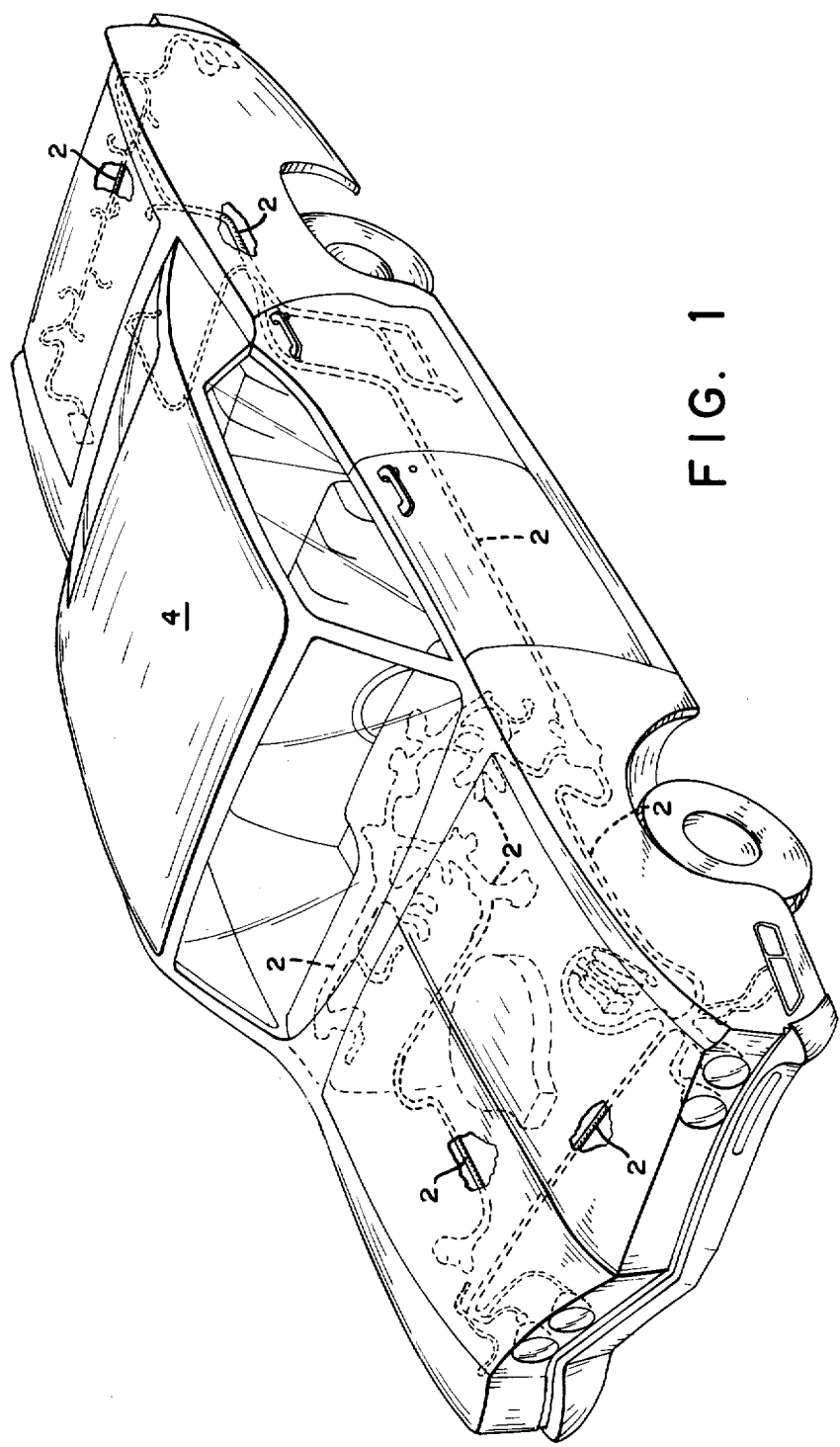
FIG. 1 is an isometric view of a wiring harness, after having been assembled and tested by the method and apparatus of this invention, and illustrates a typical use of such wiring harness in an automobile.

Referring to FIG. 1, in the example where the apparatus and method is used for assembly of wiring harnesses, the wires and other electrical components of the wiring harness 2 are adapted to supply electrical energy and provide control for the headlights, the instrument panel, the tail lights, the starting mechanism of the automobile and for a host of other electrical mechanisms used within an automobile 4 or other motor vehicles, including the optional equipment for an automobile which may vary widely, according to the choice of the purchaser. It is important that all of the electrical components of the wiring harness be assembled correctly, without the presence of shorted conditions, open conditions or other defects because such defects will cause a malfunction of the related electrical mechanisms in the automobile.

Figure 2:
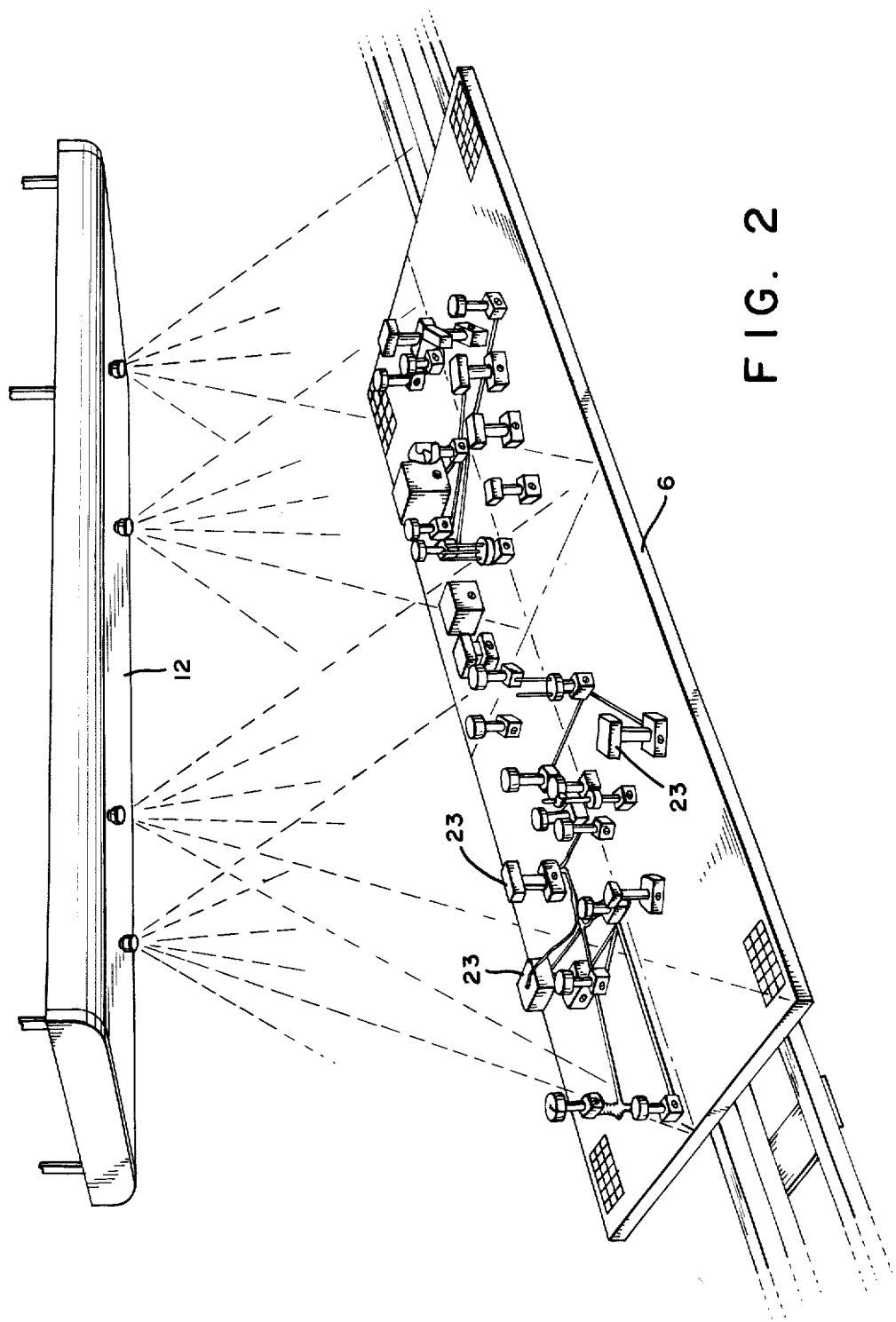
FIG. 2 is an isometric view of part of the apparatus of this invention, illustrating a pallet on which the wiring harness is assembled and an overhead projector for projecting instructions and diagrams on the pallet for the assembly of the wiring harness.
Figure 3:
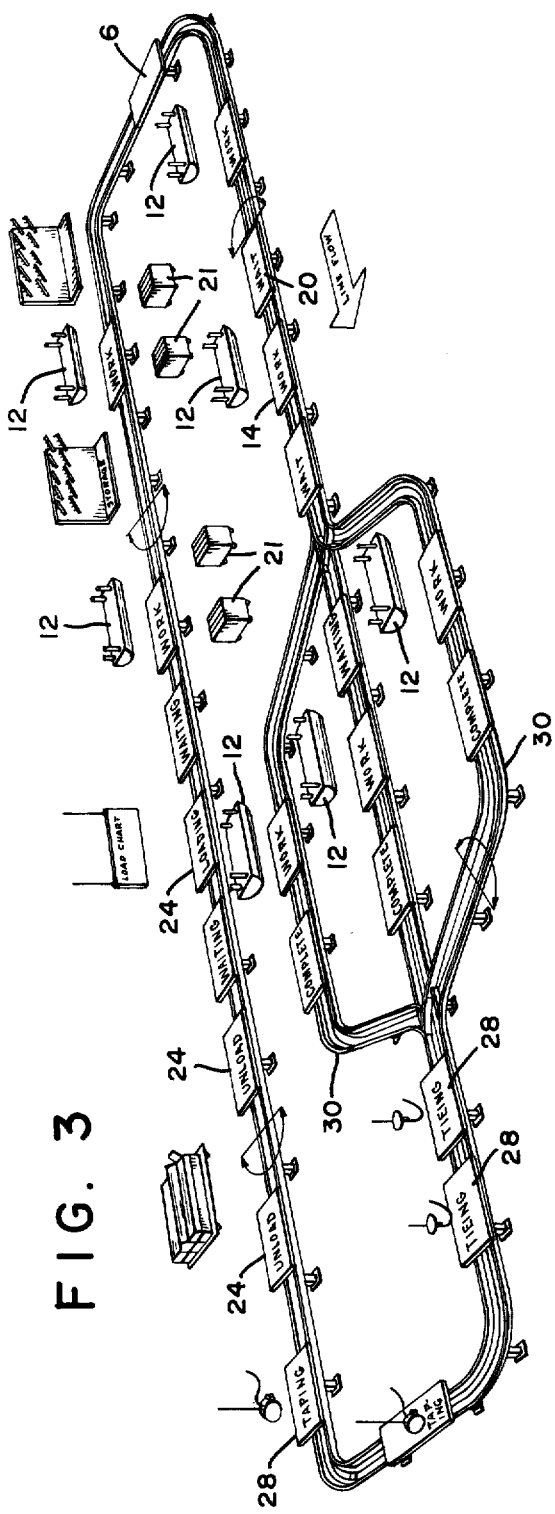
FIG. 3 is an isometric view of part of the apparatus of this invention, illustrating an assembly line having a plurality of the pallets illustrated in FIG. 2.
Figure 4:
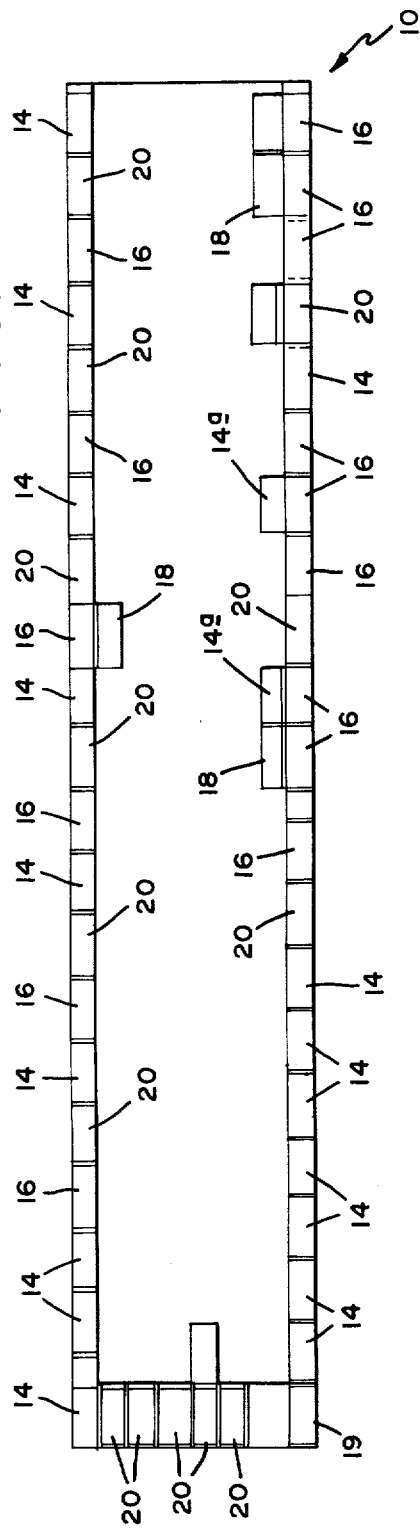
FIG. 4 is a schematic block diagram of an alternate assembly line for the assembly of wiring harnesses.

Referring to FIGS. 2, 3 and 4, the apparatus of this invention for the assembly of components includes at least one pallet 6 (FIG. 2), an assembly line 8 or 10 (FIGS. 3 and 4), a projector means 12, and an electrical testing means. Referring to FIG. 2, the components are assembled on the pallet 6. Each pallet 6 may be independently powered or, in the alternative, the assembly line 10 (FIG. 4) may be powered. Preferably, a plurality of pallets 6 are used. Referring to FIGS. 3 and 4, the pallets 6 move along an assembly line 8 or 10. Referring to FIG. 3, one type of assembly line 8 is non-powered and adapted for independently powered pallets 6. Referring to FIG. 4, an alternate type of assembly line 10 is powered and is adapted for use with non-powered pallets 6. The assembly lines 8 and 10 illustrated in FIGS. 3 and 4 are typical. Many other arrangements of assembly lines may be used. Referring to FIG. 4, the assembly line 10 has a plurality of work stations 14. Each pallet 6 is adapted to move from one work station 14 to another work station 14, independently of other pallets 6, as the electrical components are assembled on the pallet 6.

Referring to FIG. 2, a projector means 12 is provided which is disposed above selected work stations 14 of the assembly line 8 or 10. The projector means 12 is adapted to project indications on the electrical components on the pallet 6 for the assembly of the electrical components.

A plurality of testing means (not shown) are also provided for testing the electrical connection of components on the pallet 6. Such testing takes place during assembly and before completion of assembly of the components. Such testing includes determining the presence of electrical shorted conditions, electrical open conditions and incorrectly assembled components. The pallet 6 is adapted to move from one work station 14 to the next work station 14 only when and if testing by the testing means at that work station has been completed and all components have been shown to be correctly assembled at the respective work station 14. There is no possibility that a faulty harness could be assembled to completion.

Referring to FIG. 4, the assembly line 10 may include a series of work stations 14 with open stations 16, repair stations 18, inspection stations 19 and waiting stations 20 interspersed along the assembly line 10 as desired. Each pallet 6 is adapted to move from a work station 14 to a repair station 18 prior to completion of assembly of the components in the event that a defect is discovered in the assembly of the components at a particular work station 14. For example, the assembly line 10 may use a live roller system which allows any pallet 6 at a particular work station 14 to be stopped and held at that work station 14 while, at the same time, other pallets 6 at other positions or stations along the assembly line 10 are being moved by the rollers on the assembly line 10.

Work stations 14 are separated sufficiently to allow pallets 6 to be temporarily stored at open stations 16 and waiting stations 20 so that the pallets 6 will be ready and available for the next operation. With this type of assembly line design, the assembly line 10 is less subject to stoppage. Selected off-line work stations 14a are provided to which a pallet 6 may be shunted in order to allow other pallets 6 to pass by. Such off-line work stations 14a may be used for unusually long work tasks. The assembly lines 8 and 10 are easily adjustable to various production line lengths for various numbers of circuits in the harness, thus insuring flexibility in response to change in engineering design of the wiring harness.

Referring to FIG. 2, each pallet 6 preferably has a plurality of mounting bases 23 on the upper surface of the pallet 6. The mounting bases 23 are adapted to support the components, such as wiring harnesses, above the surface of the pallet 6. Some of the mounting bases 23 may be attached to the pallet 6 magnetically in order to allow the bases 23 to be easily repositioned on the pallet 6. Some of the bases 23 have electric sockets into which components of the harness may be plugged for testing. Preferably, the pallet 6 is a substantially flat, rectangular member. Preferably, the projector means 12 projects indications in the form or instructions and diagrams on the pallet 6 and on the components. As a result, the operator is provided with precise instructions and diagrams needed for the assembly of components.

Such pallets 6 are self-powered, non-synchronous power and free pallets 6. Other types of conveyance means which were considered for the apparatus of this invention included synchronous conveyors and turntables. The non-synchronous, power and free pallet 6 of this invention provides the following advantages over the synchronous conveyors and over turntables. The power and free pallet 6 of this invention can be used for assembly line systems which can be easily redesigned for various production lengths. This is important for wiring harnesses used in the automobile industry because various types of wiring harnesses are contemplated depending upon the optional equipment selected. For example, the wiring harness for an automobile having air conditioning is different from a wiring harness for a non-air conditioned automobile.

The capital investment of the power and free pallets 6 is low. If a breakdown occurs at a particular pallet 6 or a particular work station 14 along the assembly line 8 or 10 of this invention, the entire assembly line need not be stopped. In contrast, a system using a synchronous conveyor is susceptible to stoppage of the entire assembly line by a breakdown at any one location, stage or work station along the assembly line. With the apparatus of this invention, the speed of assembly can be varied at different work stations 14 and the pallets 6 moved at different rates of travel along the assembly line. In contrast, the synchronous conveyor system must be geared to the slowest operation along the assembly line. The apparatus of this invention may be used for long production cycles, whereas turntables can only be used for production cycles which are short enough to be completed on one turntable. A turntable system requires that assemblies be transported manually from one turntable to another if a longer production length is required. The apparatus of this invention does not require such manual transportation.

The apparatus of this invention can be worked from both sides of the assembly line, whereas a turntable apparatus cannot. For a turntable apparatus, synchronous movement is manditory and the assembly line is geared to the slowest operation. In summary, the power and free apparatus of this invention provides for a highly flexible work time and area. It provides greater versatility than other systems, such as a synchronous conveyor system or a turntable system.

Figure 5:
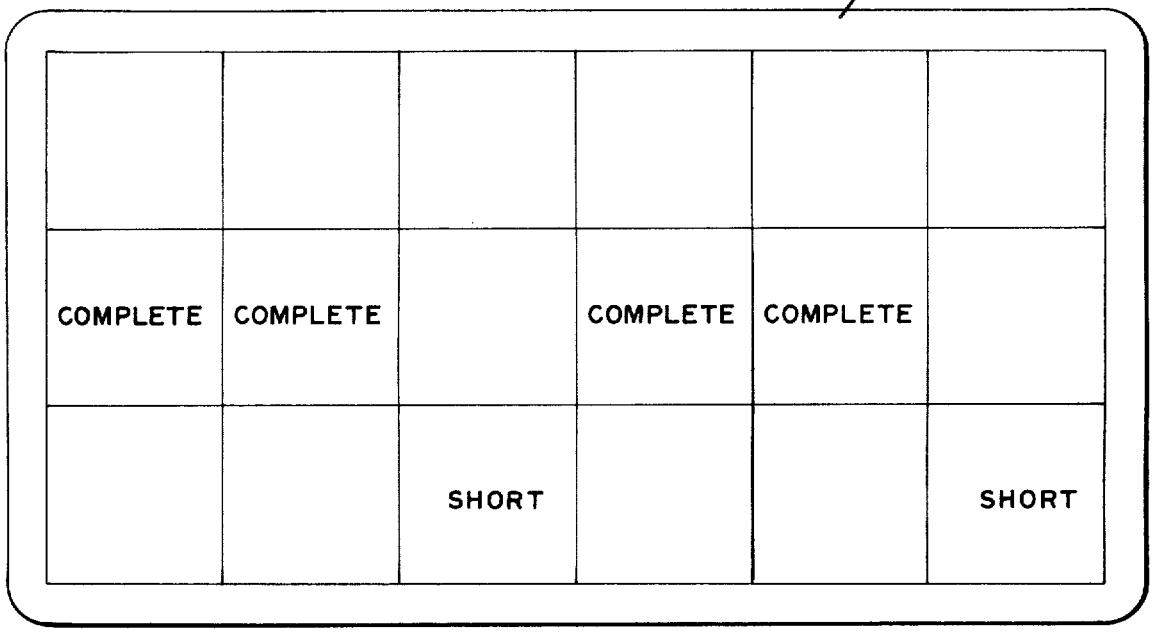
FIG. 5 is a front view of a display panel of a circuit analyzer showing the condition in which the portion of the wiring harness being tested has two shorted conditions.
Figure 6:
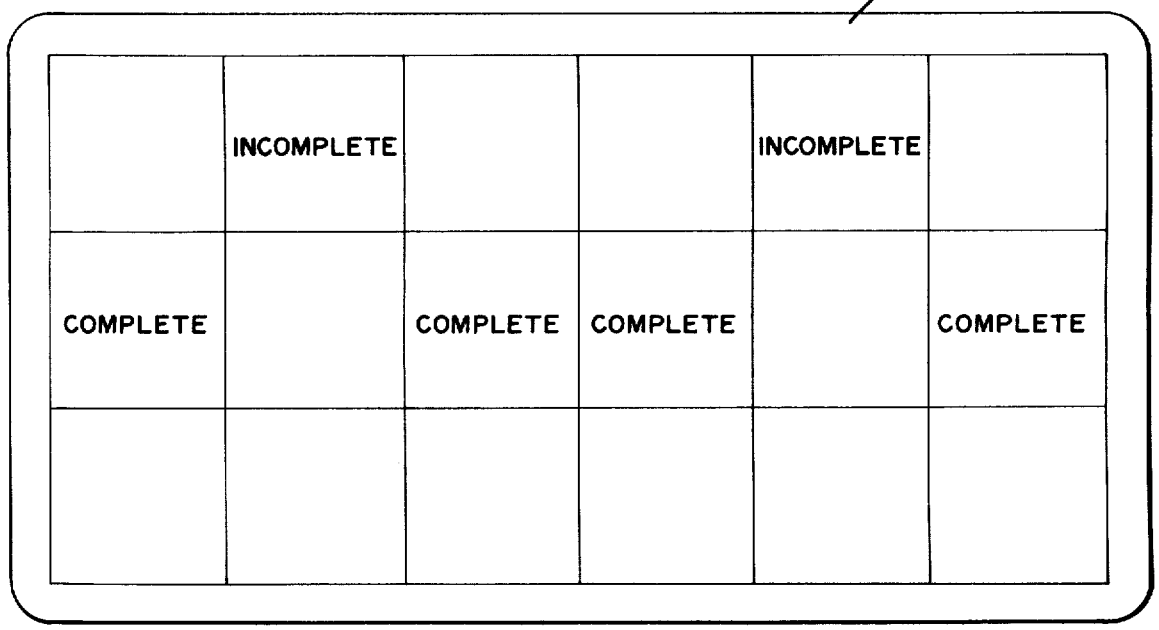
FIG. 6 is a front view of a display portion of a circuit analyzer displaying the condition in which the portion of the wiring harness being analyzed has two incomplete circuits.
Figure 7:
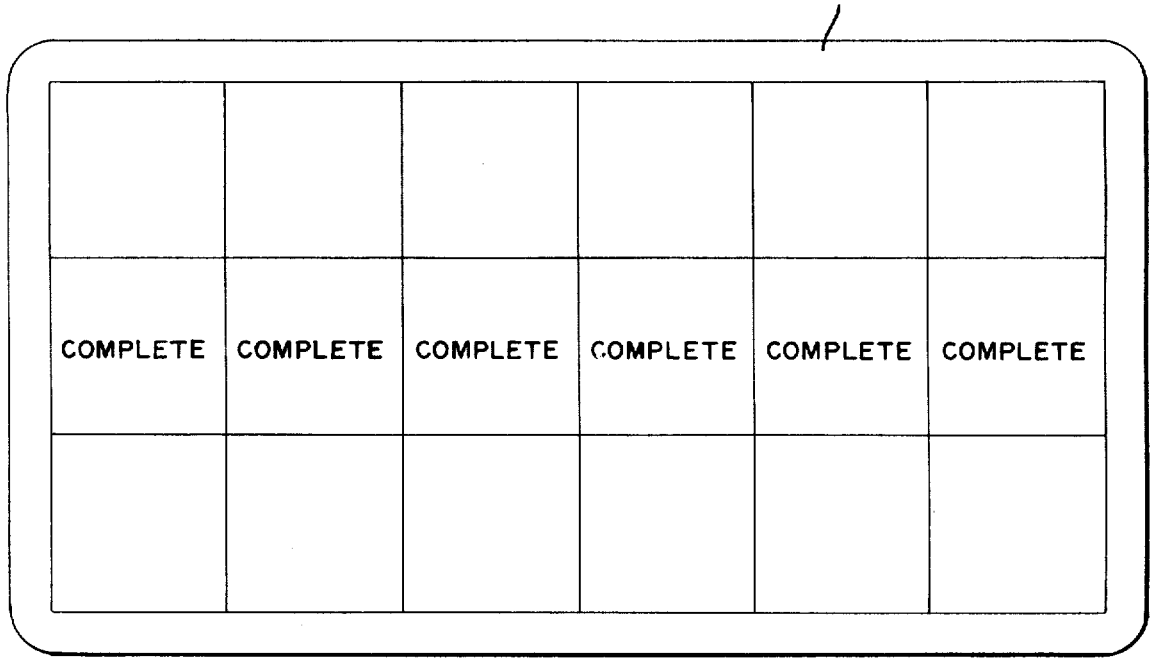
FIG. 7 is a front view of a display portion of a circuit analyzer showing the condition of the display panel when the portion of the wiring harness being tested has complete circuits.

Each pallet is preferably controlled by a circuit analyzer 21 (FIG. 3). The circuit analyzer is part of the electrical testing means which is adapted to test the wiring harness or portion of the wiring harness on the particular pallet 6 for electrical continuity and to detect conditions of electrical open, electrical short, crossed or incomplete circuits. Referring to FIGS. 5, 6 and 7, the circuit analyzer has a display panel 22 which is adapted to inform the operator at the work station 14 as to the condition of the wiring harness or the portion of the wiring harness being tested. Thus, referring to FIG. 5, the display panel 22 of the circuit analyzer will indicate when a particular circuit has a shorted condition. FIG. 5 illustrates a situation in which the display panel 22 indicates that two circuits have a shorted condition. Referring to FIG. 6, the display panel 22 of the circuit analyzer will also indicate to the assembler when the wiring harness or portion of the wiring harness being tested has incomplete circuits. For example, FIG. 6 illustrates the display panel 22 in a condition indicating two incomplete circuits. When all circuits are complete and correct in the wiring harness or in the portion of the wiring harness being tested, the display panel 22 will indicate this condition, as illustrated in FIG. 7.

The movement of the pallets 6 may be completely and directly controlled by the circuit analyzer at the particular work station 14. The pallet 6 cannot be moved from that work station to the next unless the designated portion of the wiring harness is correctly assembled. When the display panel of the circuit analyzer indicates that all circuits are complete and correct, the pallet 6 will move automatically to the next station.

Referring to FIGS. 3 and 4, the apparatus of this invention also has stations adapted to perform various functions including: stations 24 for loading or unloading of the components on a pallet 6, work stations 14 for the assembly of the components on the pallets 6, addition of preassembled modules 26, and addition of hardware, taping of the components together and unloading of the assembled components, and stations 28 for tying of components where required. Referring to FIG. 3, the assembly line 8 may include side lines 30 to which a pallet 6 may be shunted from the main assembly line when desired.

As a result, the method of this invention for the assembly of components includes electrically testing the partially assembled components at intermediate stages, at work stations 14, during assembly, prior to completion of assembly, and passing the partially assembled components to the next stage of assembly only when such testing has been completed and the components have been shown to be correctly assembled. Such testing of partially assembled components at intermediate stages of assembly along the assembly line includes testing assembled components for electrical open condition, electrical shorted conditions, and incorrectly assembled components. As noted, any partially assembled components which have been found to be defective as a result of such testing are passed to a repair stage 18 where the partially assembled components are correctly assembled. The electrical apparatus for testing the components and controlling movement of the pallets to the next station in the assembly line is not the subject of this invention.

We claim:

1. A method for assembly of components comprising:
   collecting the components to be assembled on one of the plurality of non-synchronous independently moving pallets;
   moving each pallet from one work station to another work station along an assembly line independently of other pallets;
   assembling the components on the pallets at work stations along the assembly line;
   electrically testing the partially assembled components at intermediate stages of assembly prior to completion of assembly; and
   passing the partially assembled components on the pallets to the next stage of assembly only when the testing has been completed and the components have been shown to be correctly assembled.

2. The method for assembly of electrical components according to claim 1 wherein said testing of partially assembled components at intermediate stages of assembly includes testing said electrical components for electrical open conditions, electrical shorted conditions, and incorrectly assembled components.

3. The method for assembly of electrical components according to claim 1 and further comprising:
   passing any partially assembled components which have been found to be defective as a result of said testing to a repair stage wherein said partially assembled components are correctly assembled.

4. Apparatus for the assembly of components comprising:
   a plurality of non-synchronous pallets on which the components are assembled;
   an assembly line along which said pallets move, said assembly line having a plurality of work stations, said pallets moving from one work station to another work station independently of other pallets as the components are assembled on the pallets; and
   electrical testing means for testing assembled components on said pallets before completion of assembly of the components to determine the presence of electrical shorted conditions, electrical open conditions and incorrectly assembled components, said pallets moving from one work station to the next work station only when said testing by said testing means has been completed and all components have been shown to be correctly assembled at the respective work station.

5. Apparatus for the assembly of components according to claim 4 wherein said plurality of pallets are independently powered to move along said assembly line.

6. Apparatus for the assembly of components according to claim 4 wherein said assembly line is powered to move said plurality of pallets independently of one another.

7. Apparatus for the assembly of components according to claim 4 wherein the components to be assembled are parts of a wiring harness.

8. Apparatus for the assembly of components according to claim 4 and further comprising: a projector means disposed above selected work stations of said assembly line, said projector means being adapted to project indications for the assembly of electrical components.

9. Apparatus for the assembly of electrical components according to claim 8 wherein said projector means projects instructions and diagrams on said pallet, thereby providing an operator with precise instructions and diagrams needed for the assembly of electrical components.

10. Apparatus for the assembly of electrical components according to claim 4 wherein said pallet includes a plurality of mounting bases upon which said components are supported, said mounting bases supporting said electrical components to be assembled above the surface of said pallet.

11. Apparatus for the assembly of electrical components according to claim 4 wherein said pallet is a substantially flat, rectangular structure.

12. Apparatus for the assembly of electrical components according to claim 4 wherein said assembly line further comprises a plurality of repair stations, said pallet being adapted to move from a work station to a repair station prior to completion of assembly of the electrical components in event that a defect is discovered in assembly of the electrical components at said work station.

13. Apparatus for the assembly of electrical components according to claim 4 wherein said assembly line further comprises a plurality of waiting stations, wherein said pallet may wait before proceeding any further on the assembly line.

* * * * *